United States Patent [19]

Shiochi et al.

[11] Patent Number: 4,868,705
[45] Date of Patent: Sep. 19, 1989

[54] INSULATED-GATE SEMICUSTOM INTEGRATED CIRCUIT

[75] Inventors: Masazumi Shiochi, Yokohama; Akimitsu Ugawa, Tokyo, both of Japan

[73] Assignee: Kabushiki Kaisha Toshiba, Kawasaki, Japan

[21] Appl. No.: 156,740

[22] Filed: Feb. 18, 1988

[30] Foreign Application Priority Data

Feb. 23, 1987 [JP] Japan .................................. 62-39599

[51] Int. Cl.$^4$ .......................... H02H 3/22; H02H 9/00
[52] U.S. Cl. ...................................... 361/91; 361/56; 361/111; 357/23.13; 357/41; 357/22
[58] Field of Search ...................... 361/56, 90, 91, 111, 361/110; 357/22 C, 22 D, 22 F, 22 G, 23.1, 23.13, 41; 307/304, 303

[56] References Cited

U.S. PATENT DOCUMENTS

| | | | |
|---|---|---|---|
| 4,264,941 | 4/1981 | London | 361/91 |
| 4,282,556 | 8/1981 | Ipri | 361/56 |
| 4,527,213 | 7/1985 | Ariizumi | 361/56 |
| 4,736,271 | 4/1988 | Mack et al. | 361/91 |

FOREIGN PATENT DOCUMENTS 60-142556 7/1985 Japan .

Primary Examiner—A. D. Pellinen
Assistant Examiner—David Osborn
Attorney, Agent, or Firm—Finnegan, Henderson, Farabow, Garrett & Dunner

[57] ABSTRACT

Incorporated in a MOS semicustom integrated circuit are pull-up and pull-down MOS transistors adapted for pulling up or down the potential of a signal line connecting a protection circuit with an internal circuit to be protected from electrostatic breakdown. The MOS transistors have their drains connected together to the signal line and their sources connected to a pull-up power supply node or pull-down power supply node as required. The MOS transistor acts as a pull-up or pull-down transistor when its source is connected to the pull-up or pull-down supply node by master slice wiring, and its drain junction acts as a protective diode when its source remains open. Thus, owing to the protection functions of the drain junction and diodes in the protection circuit, the electrostatic breakdown strength of the internal circuit can be increased without increase in the occupied area of the protection circuit in the integrated circuit.

10 Claims, 6 Drawing Sheets

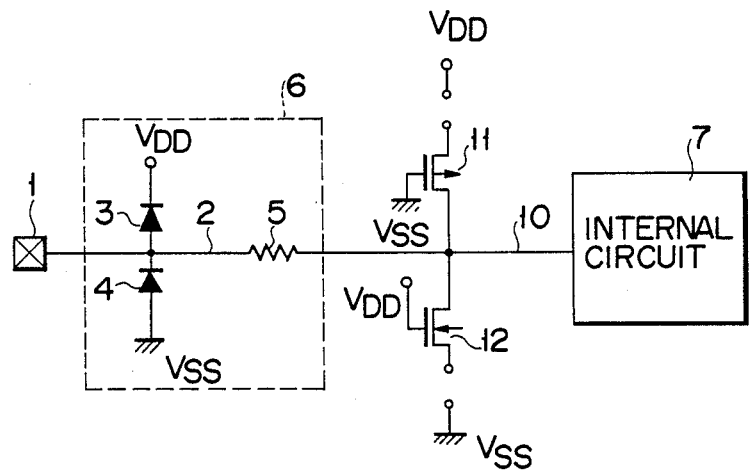
F I G. 2
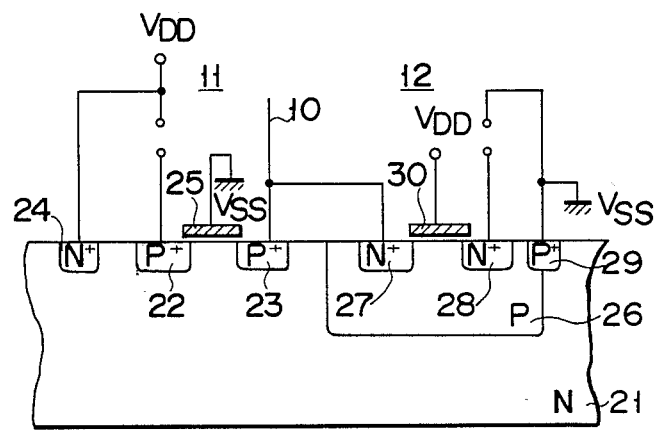
F I G. 3

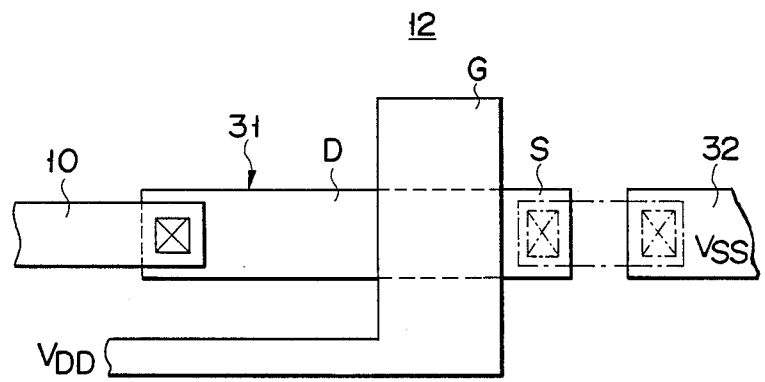
F I G. 4
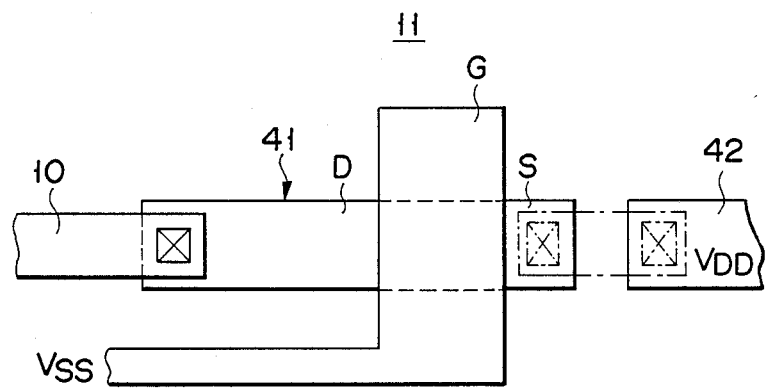
F I G. 5

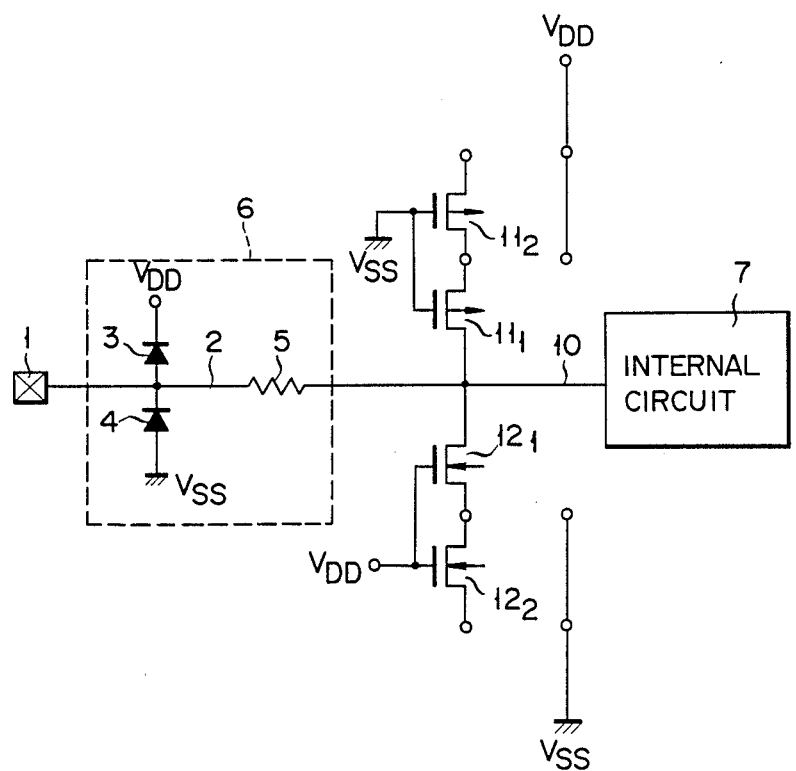
F I G. 6

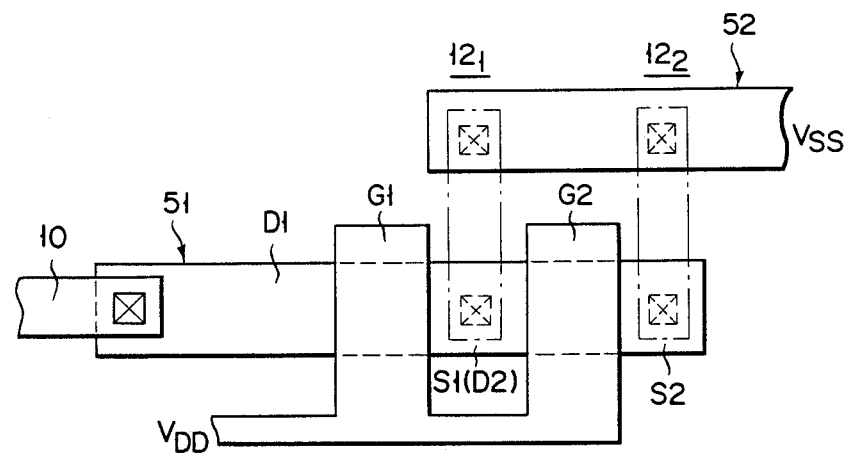
F I G. 7
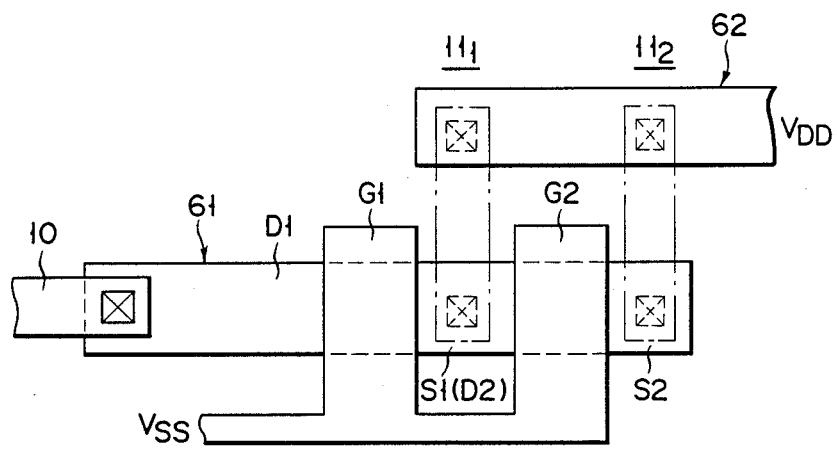
F I G. 8

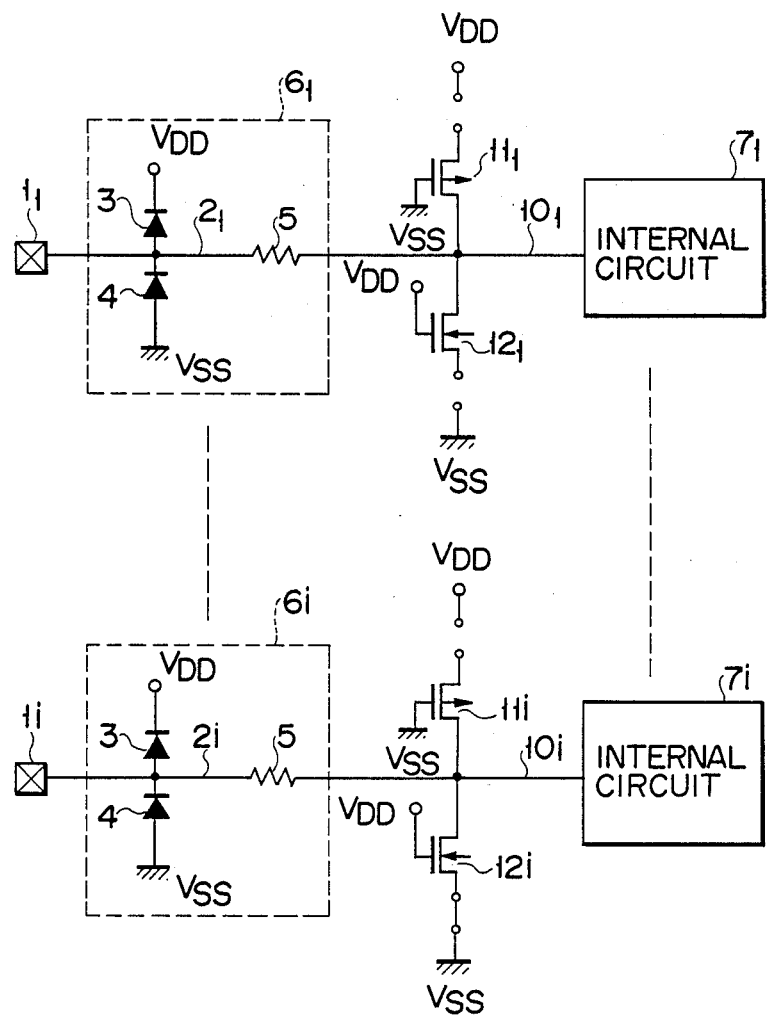
F I G. 9

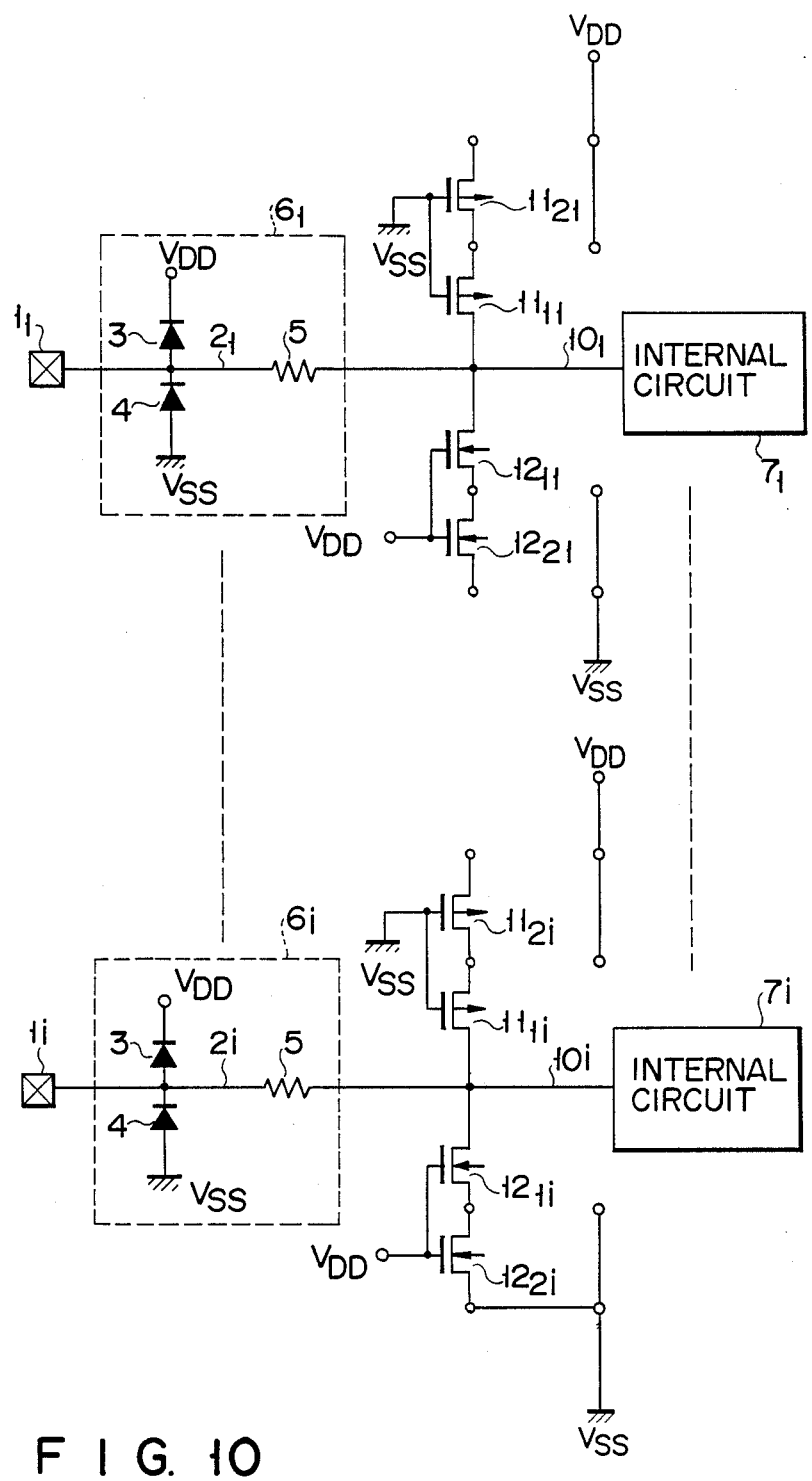
F I G. 10

INSULATED-GATE SEMICUSTOM INTEGRATED CIRCUIT

BACKGROUND OF THE INVENTION

1. Field of the Invention:

This invention relates to an insulated-gate semicustom integrated circuit, and more particularly to protection of internal circuits connected to input or output pads of the integrated circuit against electrostatic breakdown.

2. Description of the Related Art:

In general, insulated-gate, e.g. MOS (metal-oxide semiconductor) semicustom integrated circuits are provided with protection circuits in macrocells of the input/output section in order to protect internal circuits from electrostatic breakdown. A prior art protection circuit is arranged as shown in FIG. 1. That is, a diode 3 is connected between a signal line 2 connected to an input/output pad 1 and a high-potential supply voltage $V_{DD}$ node, while a diode 4 is connected between signal line 2 and a low-potential supply voltage $V_{SS}$ node (usually ground potential node). Further, a protective resistor 5 is provided between signal line 2 and internal circuit 7 to be protected.

However, the conventional protection circuit composed of diodes 3 and 4, and resistor 5 has not yet achieved a satisfactory protection strength against electrostatic breakdown. To obtain a satisfactory strength of protection against electrostatic breakdown it is required that the constituent components of the protection circuit be made large in size. In this case, however, the macrocell is also required to be made large in size, thus providing a great difficulty in making integrated circuits small.

SUMMARY OF THE INVENTION

It is an object of this invention to provide an insulated-gate semicustom integrated circuit capable of enhancing the electrostatic breakdown strength without increasing the area occupied by a protection circuit in the integrated circuit.

This invention is made by paying attention to a pull-up MOS transistor and a pull-down MOS transistor usually incorporated in an insulated-gate semicustom integrated circuit for pulling up or down the potential of a signal line connected between a protection circuit and an internal circuit, and is characterized by connecting drains of the two MOS transistors together to the signal line, and connecting sources of the pull-up or pull-down MOS transistor to a pull-up or pull-down supply voltage node as needed.

The pull-up or pull-down MOS transistor functions as such when its source is connected to the pull-up or pull-down supply voltage node by the master slice wiring. On the other hand, when their sources are open, a drain junction of each of the MOS transistors serves as a protection diode. Accordingly, owing to the protection functions of the drain junction and the diodes in the protection circuit, the electrostatic breakdown strength of the internal circuit can be enhanced without the increase in the area occupied by the protection circuit in the integrated circuit.

BRIEF DESCRIPTION OF THE DRAWINGS

FIG. 2 is a circuit diagram showing a protection circuit and protection diodes formed of drain junctions of MOS transistors in an insulated-gate type semicustom integrated circuit according to an embodiment of this invention;

FIG. 3 is a sectional view of MOS transistors in FIG. 2;

FIG. 4 shows a pattern layout of an N channel MOS transistor in FIG. 2;

FIG. 5 shows a pattern layout of a P channel MOS transistor in FIG. 2;

FIG. 6 is a circuit diagram of a protection circuit and protection diodes formed of drain junctions of MOS transistors of an insulated gate semicustom integrated circuit according to another embodiment of this invention;

FIG. 7 shows a pattern layout of N channel MOS transistors in FIG. 6;

FIG. 8 shows a pattern layout of P channel MOS transistors in FIG. 6; and

FIGS. 9 and 10 each show an MOS semicustom integrated circuit according to a further embodiment of this invention.

DETAILED DESCRIPTION OF THE PREFERRED EMBODIMENTS

Figure 1:
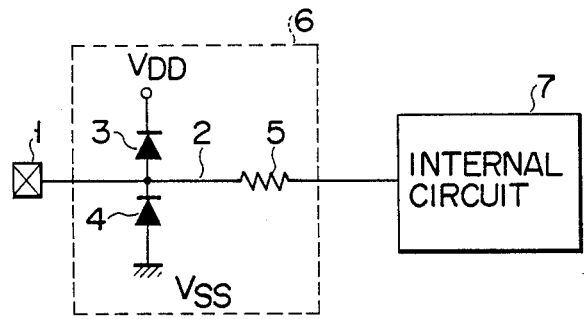
FIG. 1 is a circuit diagram of a protection circuit of a prior art MOS semicustom integrated circuit.

Referring to FIG. 2 through FIG. 4, an embodiment of this invention will be described in detail hereinafter.

FIG. 2 shows an input/output pad 1, a protection circuit 6 provided in a macrocell of an input/output section, and MOS transistors 11 and 12 used as protection diodes in an MOS semicustom integrated circuit. Protection circuit 6 comprises a signal line 2, a diode 3 connected between signal line 2 and a high-potential supply voltage $V_{DD}$ node, a diode 4 connected between signal line 2 and a low-potential supply voltage $V_{SS}$ node, and a protective resistor 5 connected between signal line 2 and a signal line 10 connected to an internal circuit 7, which is an input gate or an output buffer though not shown in detail for simplification of the drawing. MOS transistors 11 and 12 are P and N channel transistors, respectively, with their drains connected together to signal line 10. P channel transistor 11 has its gate connected to a low potential supply voltage $V_{SS}$ node (usually ground potential node), and its source opened instead of being connected to a high potential supply voltage $V_{DD}$ node. On the other hand, N channel transistor 12 has its gate connected to high potential supply voltage $V_{DD}$ node, and its source opened instead of being connected to low potential supply voltage $V_{SS}$ node. P channel transistor 11 and N channel transistor 12 are provided for pulling up and down the potential of signal line 10, respectively, as needed.

FIG. 3 shows a sectional structure of P and N channel transistors 11 and 12. Reference numeral 21 denotes an N type semiconductor substrate, 22 and 23 P+diffusion regions formed in substrate 21 which serve as source and drain regions of P channel transistor 11, respectively, 24 N+diffusion region formed in substrate 21 for providing a substrate electrode, 25 a gate electrode for P channel transistor 11 formed over a channel between P+diffusion regions 22 and 23, and 26 P well region formed in the substrate. Further, reference numerals 27 and 28 denote N+diffusion regions formed in P well 26 which serve as drain and source regions of N channel transistor 12, 29 P+diffusion region adapted for an electrode of the P well, and 30 a gate electrode for N channel transistor 12 formed over a channel between N+diffusion regions 27 and 28. Gate electrode 30 of N channel transistor 12 and substrate electrode N+diffusion region 24 are connected to the $V_{DD}$ node, while gate electrode 25 of P channel transistor 11 and P+diffusion region 29 adapted for the P well electrode are connected to the $V_{SS}$ node. The drain (P+diffusion region 23) of P channel transistor 11 and the drain (N+diffusion region 27) of N channel transistor 12 are connected together to signal line 10.

FIG. 4 shows a pattern layout of the N channel transistor 12. In the drawing reference numeral 31 represents an SDG region (source, drain and gate forming region) in which D stands for a drain region, G a gate region and S a source region. Reference numeral 10 represents the signal line which is in contact with drain region D. Gate electrode G is connected to a $V_{DD}$ power supply line which is not shown. Reference numeral 32 denotes a $V_{SS}$ power supply line which is not connected to source region S in this example.

Though the same as that of N channel transistor 12, the pattern layout of P channel transistor 11 is shown in FIG. 5. That is, reference numeral 41 denotes SDG region (source, drain, and gate forming region) in which D represents a drain region, G a gate electrode, and S a source region. Reference numeral 10 represents a signal line which is in contact with drain region D. Gate electrode G is connected to a $V_{SS}$ power supply line (not shown). Reference numeral 42 represents $V_{DD}$ power supply line which is not connected to source region S in this example.

With the MOS type semicustom integrated circuit according to this embodiment the wiring is achieved by the master slice method. That is, the sources of P and N channel transistors 11 and 12 are opened instead of being connected to $V_{DD}$ and $V_{SS}$ nodes. To be used as a pull-up transistor P channel transistor 11 has its source connected to $V_{DD}$ power supply node. Similarly, to act as a pull-down transistor the source of N channel transistor 12 is connected to $V_{SS}$ power supply node.

In the circuit shown in FIG. 2, since the sources of MOS transistors 11 and 12 are open without being connected to $V_{DD}$ and $V_{SS}$ power supply nodes, the drain junction of each of transistors 11 and 12 acts as a protective diode. Thus, the electrostatic breakdown strength of the internal circuit can be enhanced. Further, since use is made of usually prepared transistors as MOS transistors 11 and 12 the area of protection circuit 6 does not increase. Therefore, the area of the macrocell in the input/output section does not increase either.

To use MOS transistors 11 and 12 as the pull-up and pull-down transistors it is required that the respective sources of transistors 11 and 12 be connected to the power supply nodes $V_{DD}$ and $V_{SS}$ using the master slice wiring technique. For example, where transistor 12 is used as the pull-down transistor the source of transistor 12 is connected to the $V_{SS}$ power supply line as shown by a dashed-and-dotted line in FIG. 4.

Where MOS transistors 11 and 12 are each replaced with a plurality of transistors, and each transistor is used as a pull-up or pull-down transistor, the on-resistance of each transistor can be varied arbitrarily, thereby enabling the selection of resistance values of the transistors in conformity with uses for the integrated circuit.

FIG. 6 shows a circuit arrangement in which P channel transistor 11 is replaced with two transistors $11_1$ and $11_2$, and N channel transistor 12 is replaced with two transistors $12_1$ and $12_2$. A pattern layout of the transistor circuit of N channel transistors $12_1$ and $12_2$ is shown in FIG. 7, and a pattern layout of the transistor circuit of P channel transistors $11_1$ and $11_2$ is shown in FIG. 8.

In FIG. 7 reference numeral 51 denotes an SDG region, D1 a first drain region, G1 a first gate electrode, S1 (D2) a common region of a first source region and a second drain region, G2 a second gate electrode, and S2 a second source region. Drain region D1, gate electrode G1, and source region S1 form N channel transistor $12_1$. Drain region D2, gate electrode G2, and source region S2 form N channel transistor $12_2$. Signal line 10 is in contact with first drain region D1. First and second gate electrodes G1 and G2 are connected to $V_{DD}$ power supply line (not shown). Reference numeral 52 represents $V_{SS}$ power supply line. First and second source regions S1 and S2 are not connected to $V_{SS}$ power supply line 52, and second source region S2 is opened. In this open state N channel transistor $12_1$ acts as a protective diode. On the other hand, if source region S2 is connected to $V_{SS}$ power supply line 52, then N channel transistors $12_1$ and $12_2$ will act as the pull-down transistors. It is to be noted that there is a difference in the on resistance of the transistor circuit formed of N channel transistors $12_1$ and $12_2$ between the case where second source region S2 is connected to $V_{SS}$ power supply line 52 so that N channel transistors $12_1$ and $12_2$ are operated in a series connected circuit, and the case where first source region S1 is connected to $V_{SS}$ power supply line 52 and second source region S2 is remained open so that N channel transistor $12_1$ is only operated. Thus, it is made possible to select a desired on resistance value in accordance with a use for the integrated circuit.

In FIG. 8 reference numeral 61 denotes an SDG region, D1 a first drain region, G1 a first gate electrode, S1 (D2) a common region of a first source region and a second drain region, G2 a second gate electrode, and S2 a second source region. Drain region D1, gate electrode G1, and source region S1 form P channel transistor $11_1$. Drain region D2, gate electrode G2, and source region S2 form P channel transistor $11_2$. Signal line 10 is in contact with first drain region D1. First and second gate electrodes G1 and G2 are connected to the $V_{SS}$ power supply line (not shown). Reference numeral 62 represents the $V_{DD}$ power supply line. First source region S1 and second source region S2 are not connected to $V_{DD}$ power supply line 62, and second source region S2 is opened. In this open state P channel transistor $11_1$ acts as a protective diode. On the other hand, if source region S2 is connected to $V_{DD}$ power supply line 62, as shown by dotted-and-dashed line in FIG. 8, then P channel transistors $11_1$ and $11_2$ will act as the pull-up transistors. The on resistance of the transistor circuit formed of P channel transistors $11_1$ and $11_2$ differs between the case where second source region S2 is connected to $V_{DD}$ power supply line 62 so that N channel transistors $11_1$ and $11_2$ are operated in a series connected circuit, and the case where first source region S1 is connected to $V_{DD}$ power supply line 62 and second source region S2 is remained open so that N channel transistor $11_1$ is only operated. Thus, it is made possible to select a desired on resistance value in accordance with a use for the integrated circuit.

FIG. 9 shows a MOS type semicustom integrated circuit according to still another embodiment of this invention.

In this embodiment, protection circuit $6i$ is connected to signal line $2i$ which is connected to input or output pad $1i$ (I stands for a pad number). Further, between signal line 10i connecting protection circuit 6i and internal circuit 7i together and power supply node $V_{DD}$ is connected pull-up P channel MOS transistor 11i, and between signal line 10i and power supply node $V_{SS}$ is connected pull-down N channel MOS transistor 12i. In this drawing the source of pull-up transistor 11i is open, while the source of pull-down transistor 12i is connected to $V_{SS}$ node. Thus, signal line 10i is pulled down to about $V_{SS}$.

Since the circuit composed of pad 1i, signal line 2i, protection circuit 6i, internal circuit 7i, P channel transistor 11i, and N channel transistor 12i is the same as the circuit shown in FIG. 2 the description thereof is omitted.

FIG. 10 shows a MOS type semicustom integrated circuit according to a further embodiment of this invention.

In this embodiment, protection circuit 6i is connected to signal line 2i which is connected to input or output pad 1i (i stands for a pad number). Further, between signal line 10i connecting protection circuit 6i and internal circuit 7i together and power supply node $V_{DD}$ are connected pull-up P channel MOS transistors $11_{1i}$ and $11_{2i}$, and between signal line 10i and power supply node $V_{SS}$ are connected pull-down N channel MOS transistors $12_{1i}$ and $12_{2i}$. In this drawing the source of pull-up transistor $11_{2i}$ is open, while the source of pull-down transistor $12_{2i}$ is connected to $V_{SS}$ node. Thus, signal line 10i is pulled down to about $V_{SS}$.

Since the circuit composed of pad 1i, signal line 2i, protection circuit 6i, internal circuit 7i, P channel transistors $11_{1i}$ and $11_{2i}$, and N channel transistors $12_{1i}$ and $12_{2i}$ is the same as the circuit shown in FIG. 6 the description thereof is omitted.

As described above, according to the insulated-gate semicustom integrated circuit of this invention, the drain of a MOS transistor that has been previously prepared to pull up or down the signal line connected between the protection circuit and the internal circuit to be protected is connected to the signal line. Therefor, where the MOS transistor is not used for pulling up or down the signal line, by keeping the source of the MOS transistor open instead of connecting to a power supply node, the drain junction of the transistor can be used as a protective diode. Thus, the protection strength of the internal circuit against electrostatic breakdown can be improved.

What is claimed is:

1. An insulated-gate semicustom integrated circuit comprising:
    a protection circuit comprising
        first protective diodes each having one end connected to a first signal line, and
        a resistor element inserted in said first signal line, said first signal line having one end connected to one end of a first input pad and a first output pad; and
    a second protective diode comprising a pull-up/down MOS transistor having a drain connected to a second signal line, a source remaining open, and a gate connected to a fixed potential, said second signal line connecting a second end of said first signal line to a first internal circuit.

2. An insulated-gate semicustom integrated circuit according to claim 1, wherein said MOS transistor functions as a pull-up transistor when its source is connected to a power supply node by a master slice wiring method.

3. An insulated-gate semicustom integrated circuit according to claim 2, further comprising a further MOS transistor connected between said drain of said MOS transistor and said second signal line.

4. An insulated-gate semicustom integrated circuit according to claim 3, wherein said further MOS transistor has a source connected to the drain of said MOS transistor.

5. An insulated-gate semicustom integrated circuit according to claim 3, wherein said further MOS transistor has a source connected to a power supply.

6. An insulated-gate semicustom integrated circuit according to claim 1, wherein said MOS transistor functions as a pull-down transistor when its source is connected to a power supply node by a master slice wiring method.

7. An insulated-gate semicustom integrated circuit according to claim 6, further comprising a further MOS transistor connected between said drain of said pull-up/down MOS transistor and said second signal line.

8. An insulated-gate semicustom integrated circuit according to claim 7, wherein said further MOS transistor has a source connected to the drain of said pull-up/down MOS transistor.

9. An insulated-gate semicustom integrated circuit according to claim 7, wherein said further MOS transistor has a source connected to a power supply.

10. An insulated-gate semicustom integrated circuit according to claim 1, further comprising:
    an additional protection circuit comprising
        additional first protective diodes each having one end connected to an additional first signal line, and
        an additional resistor element inserted in said additional first signal line, said additional first signal line having one end connected to one end of an additional input pad and an additional output pad; and
    an additional second protective diode comprising an additional pull-up/down MOS transistor having a drain connected to an additional second signal line, a source remaining open, and a gate connected to a power source potential, said additional second signal line connecting a second end of said additional first signal line to an additional first internal circuit.

* * * * *